(12) United States Patent
Wu et al.

(10) Patent No.: US 10,777,951 B2
(45) Date of Patent: Sep. 15, 2020

(54) CABLE CONNECTOR ASSEMBLY

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Jerry Wu, Irvine, CA (US); Jun Chen, Kunshan (CN); Fan-Bo Meng, Kunshan (CN)

(73) Assignees: FOXCONN (KUNSHAN) COMPUTER CONNECTOR C, Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/451,798

(22) Filed: Jun. 25, 2019

(65) Prior Publication Data

US 2019/0393656 A1    Dec. 26, 2019

(30) Foreign Application Priority Data

Jun. 25, 2018 (CN) .......................... 2018 1 0663331

(51) Int. Cl.
*H01R 24/60* (2011.01)
*H01R 12/70* (2011.01)
*H01R 13/6585* (2011.01)

(52) U.S. Cl.
CPC ............ *H01R 24/60* (2013.01); *H01R 12/70* (2013.01); *H01R 13/6585* (2013.01)

(58) Field of Classification Search
CPC .... H01R 13/6469; H01R 12/57; H01R 24/60; H01R 13/6585
See application file for complete search history.

(56) References Cited

U.S. PATENT DOCUMENTS

| | | | | |
|---|---|---|---|---|
| 8,608,504 B2 * | 12/2013 | Tseng | ..................... | H01R 9/034 |
| | | | | 439/326 |
| 9,306,334 B2 * | 4/2016 | Zhu | ..................... | H05K 1/0219 |
| 9,570,861 B2 * | 2/2017 | Thackston | ............ | H01R 12/62 |
| 9,698,544 B2 * | 7/2017 | Wu | ..................... | H01R 13/7175 |
| 9,774,111 B2 * | 9/2017 | Liang | ..................... | H01R 12/57 |
| 9,843,143 B2 * | 12/2017 | Wu | ..................... | H01R 13/665 |
| 9,979,145 B2 * | 5/2018 | Wu | ..................... | H01R 24/60 |
| 10,063,018 B2 * | 8/2018 | Xing | ................. | H01R 13/7172 |
| 10,211,552 B2 * | 2/2019 | Zhu | ..................... | H01R 13/5833 |
| 10,333,263 B2 * | 6/2019 | Wu | ..................... | H01R 24/64 |
| 10,348,010 B2 * | 7/2019 | Wu | ..................... | H01R 12/778 |
| 2006/0228935 A1 * | 10/2006 | Wen | ................... | H01R 13/6474 |
| | | | | 439/497 |

(Continued)

*Primary Examiner* — Briggitte R. Hammond
(74) *Attorney, Agent, or Firm* — Wei Te Chung; Ming Chieh Chang

(57) ABSTRACT

A cable connector assembly includes a plug for mating with a docking connector, a printed circuit board electrically connected to the plug and a cable electrically connected to the connector, the plug includes a plurality of conductive terminals, the cable includes a plurality of high speed signal cores for transmitting high speed signals and low speed signal cores for transmitting low speed signals, wherein the electrical path of the high speed signal cores connected to the corresponding conductive terminals is shorter than the electrical path of the low speed signal cores connected to the corresponding conductive terminals.

15 Claims, 10 Drawing Sheets

(56) References Cited

U.S. PATENT DOCUMENTS

| | | | |
|---|---|---|---|
| 2011/0151716 A1* | 6/2011 | Kondo | H01R 13/6471 |
| | | | 439/607.01 |
| 2016/0079689 A1* | 3/2016 | Wu | B23K 26/24 |
| | | | 439/581 |
| 2016/0079714 A1* | 3/2016 | Wu | H01R 13/6585 |
| | | | 439/607.05 |
| 2017/0040749 A1* | 2/2017 | Tsai | H01R 13/6587 |
| 2018/0261956 A1* | 9/2018 | Yamaguchi | H01R 13/5804 |
| 2019/0393656 A1* | 12/2019 | Wu | H05K 1/00 |

\* cited by examiner

CABLE CONNECTOR ASSEMBLY

BACKGROUND OF THE INVENTION

1. Field of the Invention

The present invention relates generally to a cable connector assembly, and more particularly to an electrical connector with high speed signal transmission structure.

2. Description of Related Arts

A USB-C type cable connector assembly is disclosed in U.S. Pat. No. 9,774,111, issued on Sep. 26, 2017. The cable connector assembly includes a plug, a circuit board electrically connected to the plug, and a cable electrically connected to the printed circuit board. The rear side of the printed circuit board includes cable pads soldered to the cable, the front side of the circuit board includes terminal pads electrically connected to the plug. A conductive path connects the cable pads and the terminal pads. All the cable pads are placed side by side on the rear side of the printed circuit board. The cable connector assembly includes a high speed path for transmitting high speed signals and a low speed path for transmitting low speed signals. When the high-speed signal passes through the printed circuit board, there is attenuation. The transmission length of the high-speed signal on the circuit board should be shortened. In this design, all the conductive paths on the printed circuit board are of equal length, which makes it difficult to realize high-speed signal transmission.

An improved cable connector assembly is desired.

SUMMARY OF THE INVENTION

An object of the present invention is to provide an cable connector assembly in which a high speed signal has a short transmission distance on the printed circuit board, thereby facilitating high speed signal transmission.

To achieve the above-mentioned object, a cable connector assembly includes a plug for mating with a docking connector, a printed circuit board electrically connected to the plug and a cable electrically connected to the connector, the plug includes a plurality of conductive terminals, the cable includes a plurality of high speed signal cores for transmitting high speed signals and low speed signal cores for transmitting low speed signals, wherein the electrical path of the high speed signal cores connected to the corresponding conductive terminals is shorter than the electrical path of the low speed signal cores connected to the corresponding conductive terminals.

Compared to the prior art, the path of the high-speed signal transmitted on the printed circuit board of the cable connector assembly of the present invention is shorter than the path for transmitting the low speed signal, thereby shortening the transmission distance of the high-speed signal in the circuit board as much as possible, and facilitating higher-speed signal transmission.

DETAILED DESCRIPTION OF THE PREFERRED EMBODIMENT

Figure 1:
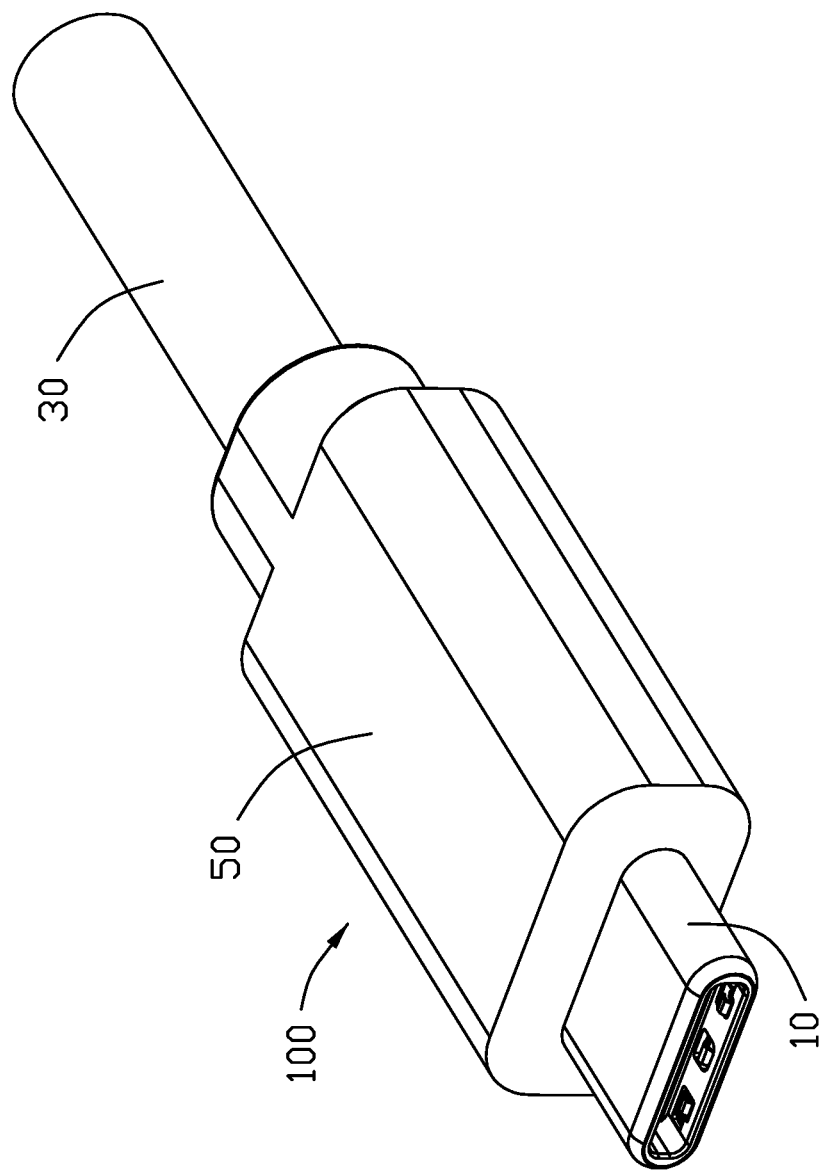
FIG. 1 is a perspective view of a cable connector assembly in accordance with the present invention.
Figure 2:
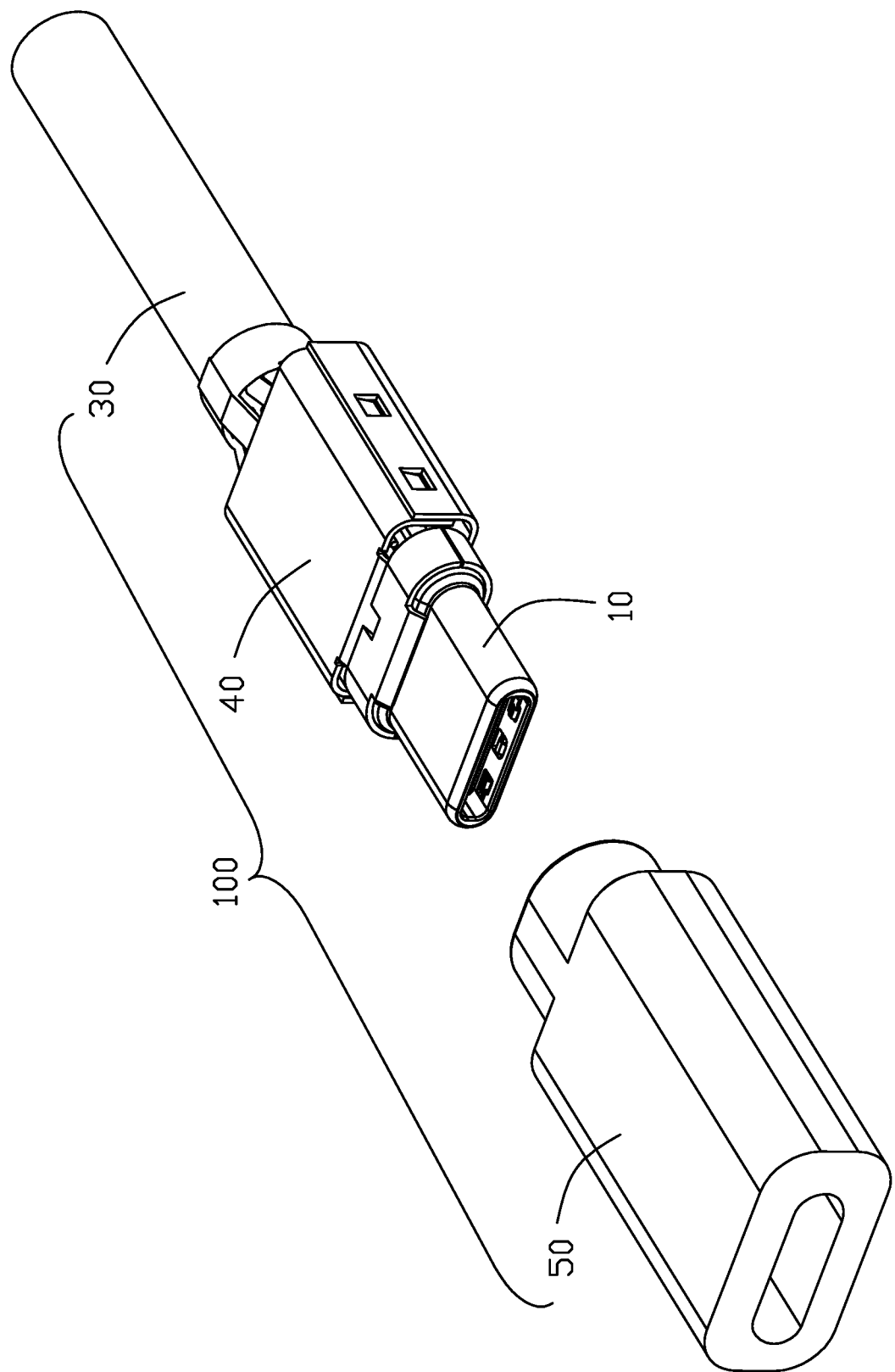
FIG. 2 is a partially exploded perspective view of the cable connector assembly as shown in FIG. 1.
Figure 3:
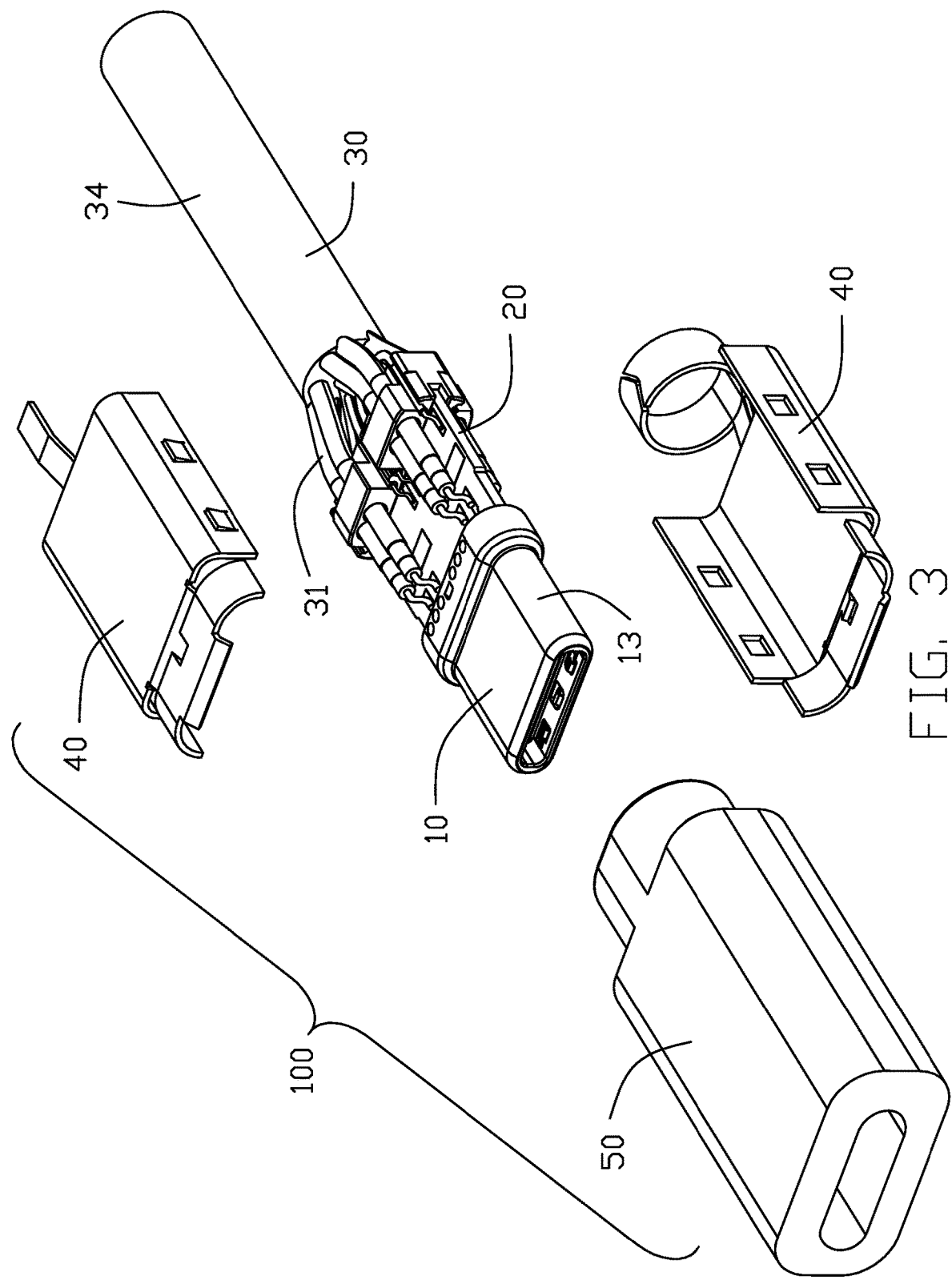
FIG. 3 is a further partially exploded perspective view of the cable connector assembly as shown in FIG. 2.
Figure 4:
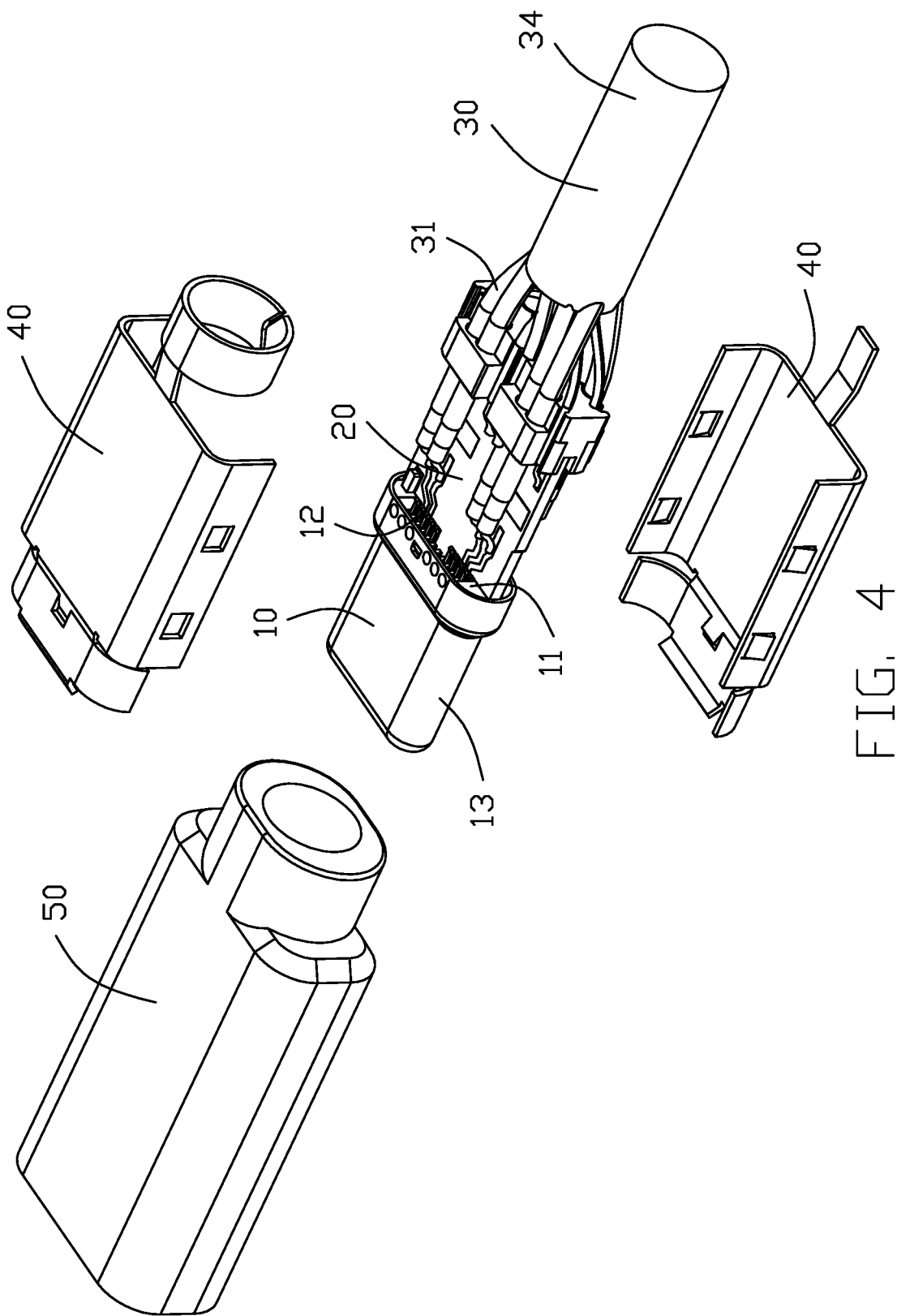
FIG. 4 is another further partially exploded view of the cable connector assembly as shown in FIG. 3.
Figure 5:
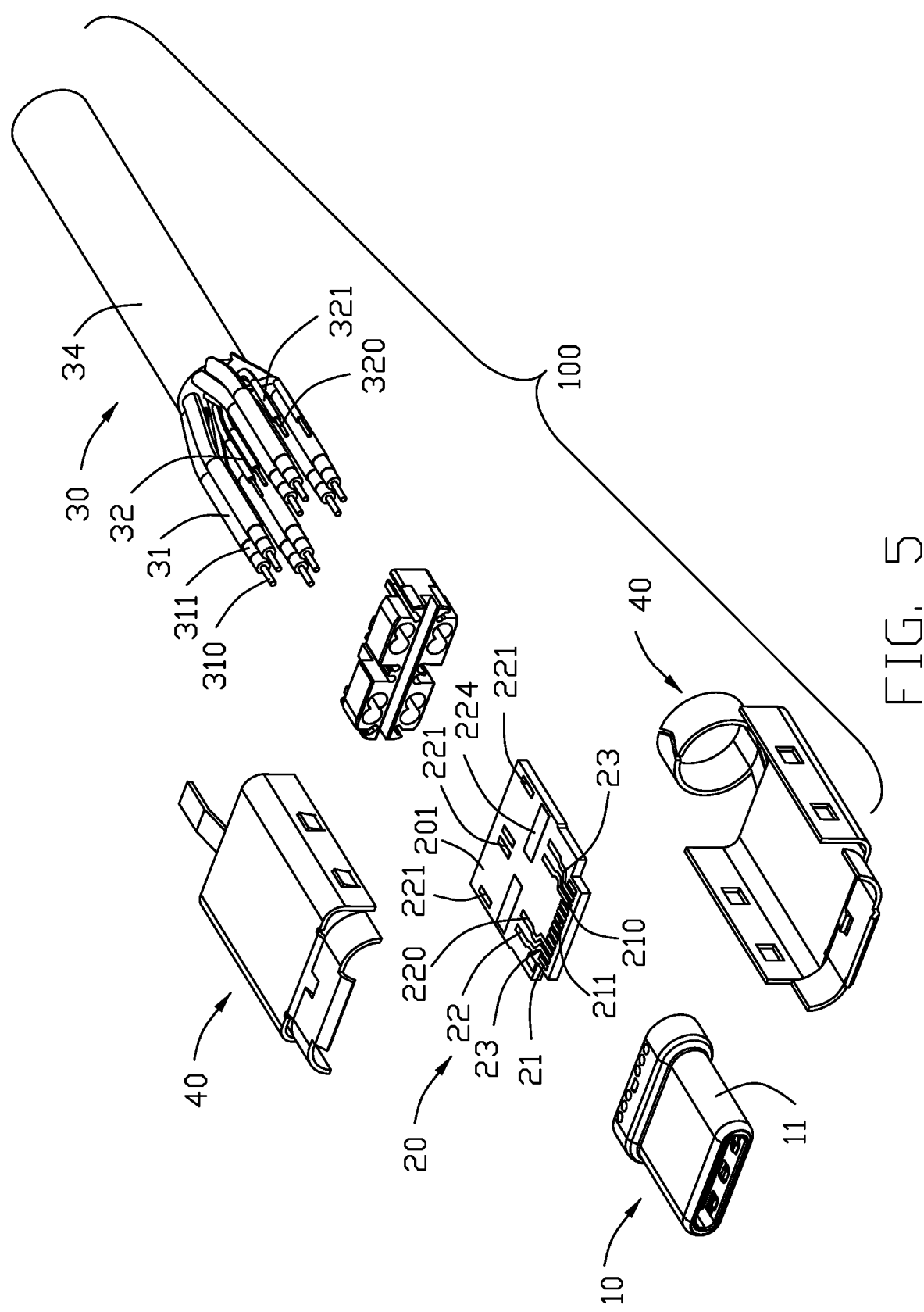
FIG. 5 is a further exploded view of the cable connector assembly as shown in FIG. 3.
Figure 6:
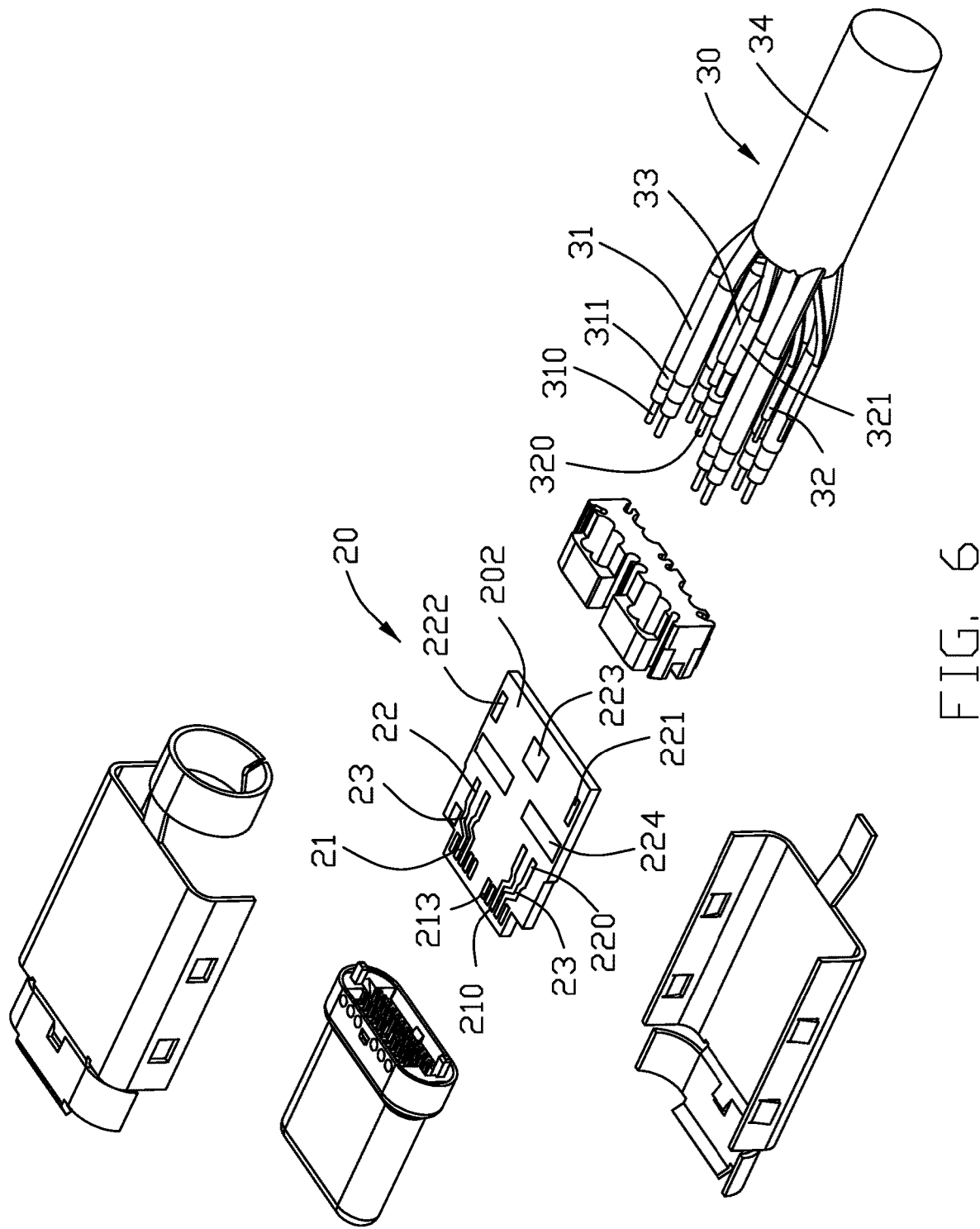
FIG. 6 is another further exploded view of the cable connector assembly as shown in FIG. 5.
Figure 7:
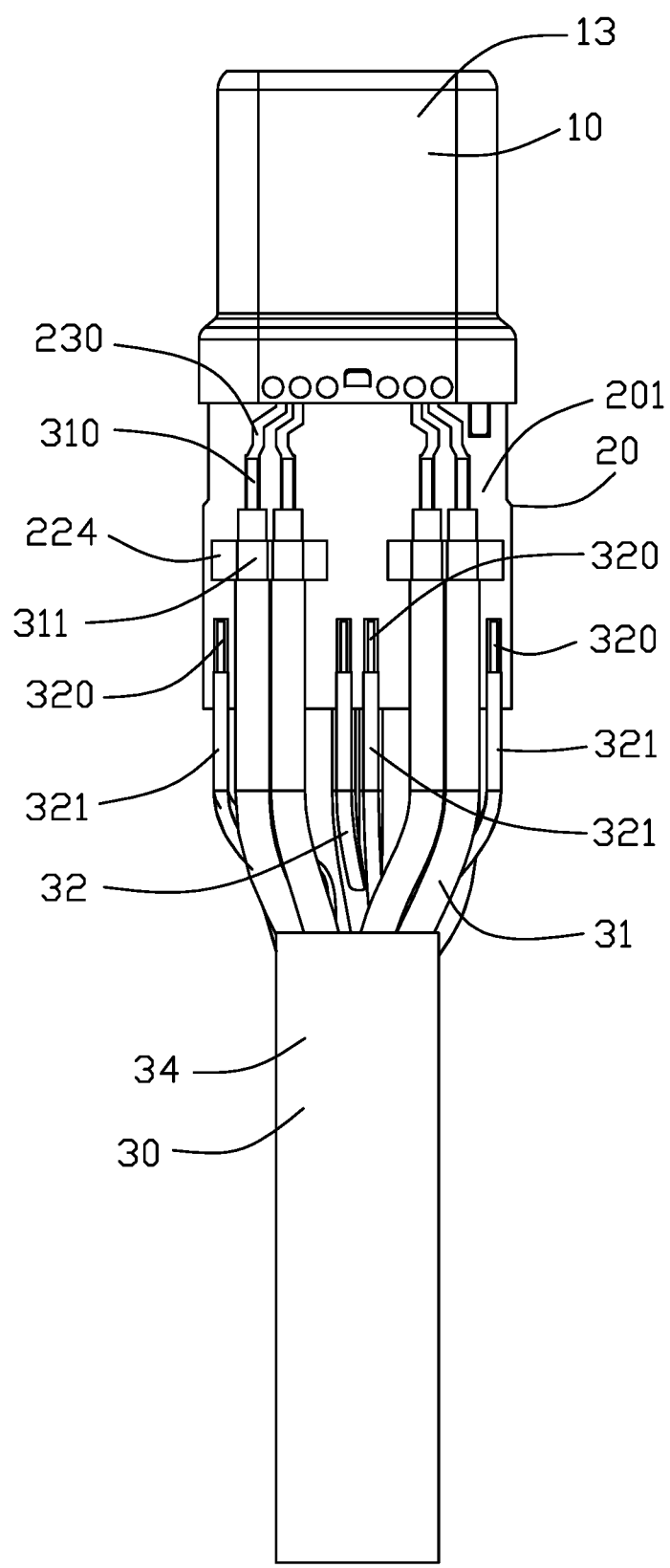
FIG. 7 is a bottom view of the cable connector assembly as shown in FIG. 1, exposing the cable soldering with the printed board circuit.
Figure 8:
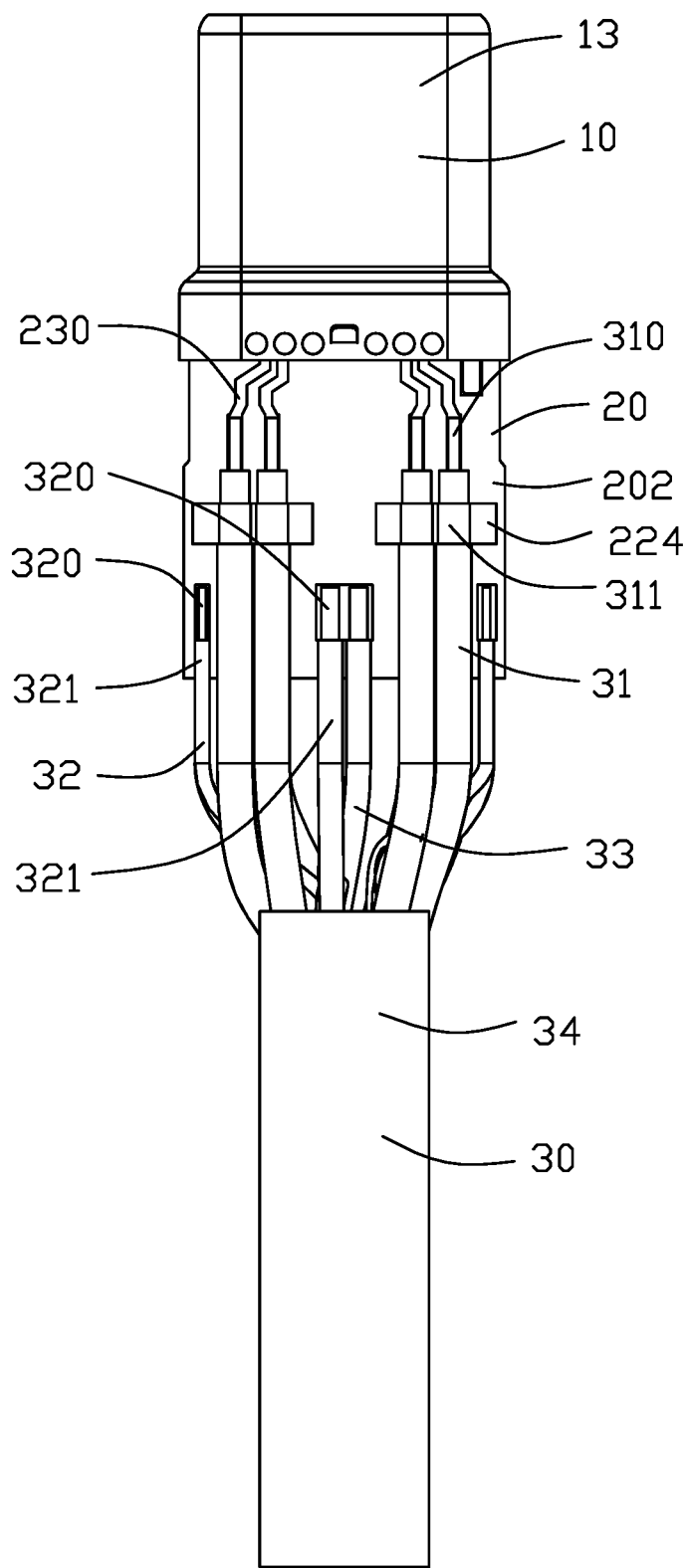
FIG. 8 is a top view of the cable connector assembly as shown in FIG. 7, exposing the cable soldering with the printed board circuit.

Referring to FIGS. 1-8, an electrical connector 100 of the present invention is configured to mate with a docking connector in two opposite directions. The cable connector assembly 100 includes a plug, a printed circuit board 20 electrically connected to the plug, a cable 30 electrically connected to the circuit board 20, a metal cage 40 mounted on the plug and cable and covering the printed circuit board, and an insulative casing 50 disposed outside the metal cage 40. The cable 30 is electrically connected to the plug 10 through the printed circuit board 20. The cable connector assembly 100 conforms to the Thunderbolt 3.0 specification, which can transmit at a speed of 20 Gbps or higher per channel while providing 5 A of current.

The plug 10 includes an insulative housing 11, a plurality of conductive terminals 12 received in the insulative housing 11, and a metal housing 13 disposed outside the insulative housing 11. The conductive terminals 12 are arranged in two rows spaced apart in the vertical direction, and the rows of the conductive terminals 12 are arranged at intervals in the left-right direction.

The cable 30 includes a plurality of high speed signal cores 31 for transmitting high speed signals, a plurality of low speed signal cores 32 for transmitting low speed signals, a power core 33 for transmitting power, and an outer layer 34. The outer layer 34 covers the high speed signal cores 31, the low speed signal cores 32 and the power core 33. The electrical path of the high speed signal cores 31 connected to the corresponding conductive terminals 12 is shorter than the electrical path of the low speed signal core 32 connected to the corresponding conductive terminals 12. The high speed signal cores 31 are coaxial wires and include a center conductor 310 and a shielding layer 311 disposed outside the center conductor 310 and insulated from each other. The low speed signal cores 32 and the power core 33 include a conductor 320 and an insulative layer 321 wrapped around the outside of the conductor 320.

The printed circuit board 20 includes a first face 201 and a second face 202 disposed opposite the first face 201. The first surface 201 and the second surface 202 of the printed circuit board respectively includes a plurality of terminal pads 21 electrically connected to the conductive terminals 12, a plurality of cable pads 22 soldered to the cable 30, and a conductive path 23 connecting with the terminal pads 21 and cable pads 22. The terminal pads 21 include high-speed terminal pads 210 for transmitting high-speed signals, low-speed terminal pads 211 for transmitting low-speed signals, and power terminal pads 212 for transmitting power signals. The cable pads 22 include high-speed terminal pads 220 for transmitting high-speed signals, low-speed terminal pads 221 for transmitting low-speed signals, internal power pads 222 for transmitting internal power and power pads 223 for transmitting power signals. The high speed conductive path 230 connected to the high speed pads 220 and the corresponding high speed terminal pads 210 is shorter than the low speed conductive path 231 connected to the low speed pads 221 and the corresponding low speed terminal pads 211. The width of the high speed conductive path 230 is greater than the width of the low speed conductive path 231. The high speed pads 220 on the first side 201 and the second side 202 are arranged in a row, and the low speed pads 221, the internal power pads 222, and the power pads 223 are arranged in another row. The high speed pads 220 are closer to the plug 10 than the low speed pads 221, the internal power pads 222 or the power pads 223. The printed circuit board 20 is provided with ground pads 224 on the rear side of the high speed pads 220. The center conductor 310 of the high speed signal cores 31 is soldered to corresponding high speed pads 220, and the shield layer 311 is soldered to the corresponding ground pads 224. On the first side 201, the low speed pads 221 include a first low speed pad 2210 disposed at an outermost area in a lateral direction of the printed circuit board 20, and a second low speed pad 2211 disposed at an intermediate portion of the printed circuit board 20 in a lateral direction. The first low speed pad 2210 is soldered to the conductor 320 of the low speed signal core 32 for transmitting a detection signal (CC) and a first standby signal (SBU1) channel, respectively. The second low speed pad 2211 includes a pair, and solders to the conductor 320 of the twisted pair low speed signal core 32 for transmitting USB 2.0 signals. The high-speed signal cores 31 are spaced between the first low speed pad 2210 and the second low-speed pad 2211. Maximizing the spacing between the channel transmitting the detection signal and the channel serving as the first standby signal, and separating the high-speed signal cores 31 from the channel for transmitting the USB2.0 signal in the middle, the shielding layer of the high-speed signal cores 31 can further function to shield the two-sided channels to prevent coupling effects between the first low speed pad 2210 and the second low-speed pad 2211. On the second side 202, the low speed pads 221 include a third low speed pad 2212 disposed at an outermost area in a lateral direction of the circuit board 20. The power pads 223 are disposed in a middle portion of the printed circuit board 20 in the lateral direction. The third low speed pad 2212 is soldered to the conductor 320 of the low speed signal cores 32 and serves as a second standby signal (SBU2) channel and transmits an internal power source, respectively. The power pads 223 are soldered to the conductor 320 of the power core 33 for transmitting the power signal. The high speed signal cores 31 are also interposed between the third low-speed pad 2212 and the power pads 223, and between the internal power pads 222 and the power pads 223. The first standby signal channel and the second standby signal channel are disposed on opposite sides of the printed circuit board 20, and separating the high-speed signal cores 31 from the channel of the intermediate transmission power signal. The shielding layer of the high speed signal cores 31 can further function to shield the two-sided channels to prevent coupling effects between the first standby signal channel and the second standby signal channel. The high speed signal cores 31 are divided into two rows of low speed signal cores 32 and power core 33 to ensure the stability of the soldering.

Figure 9:
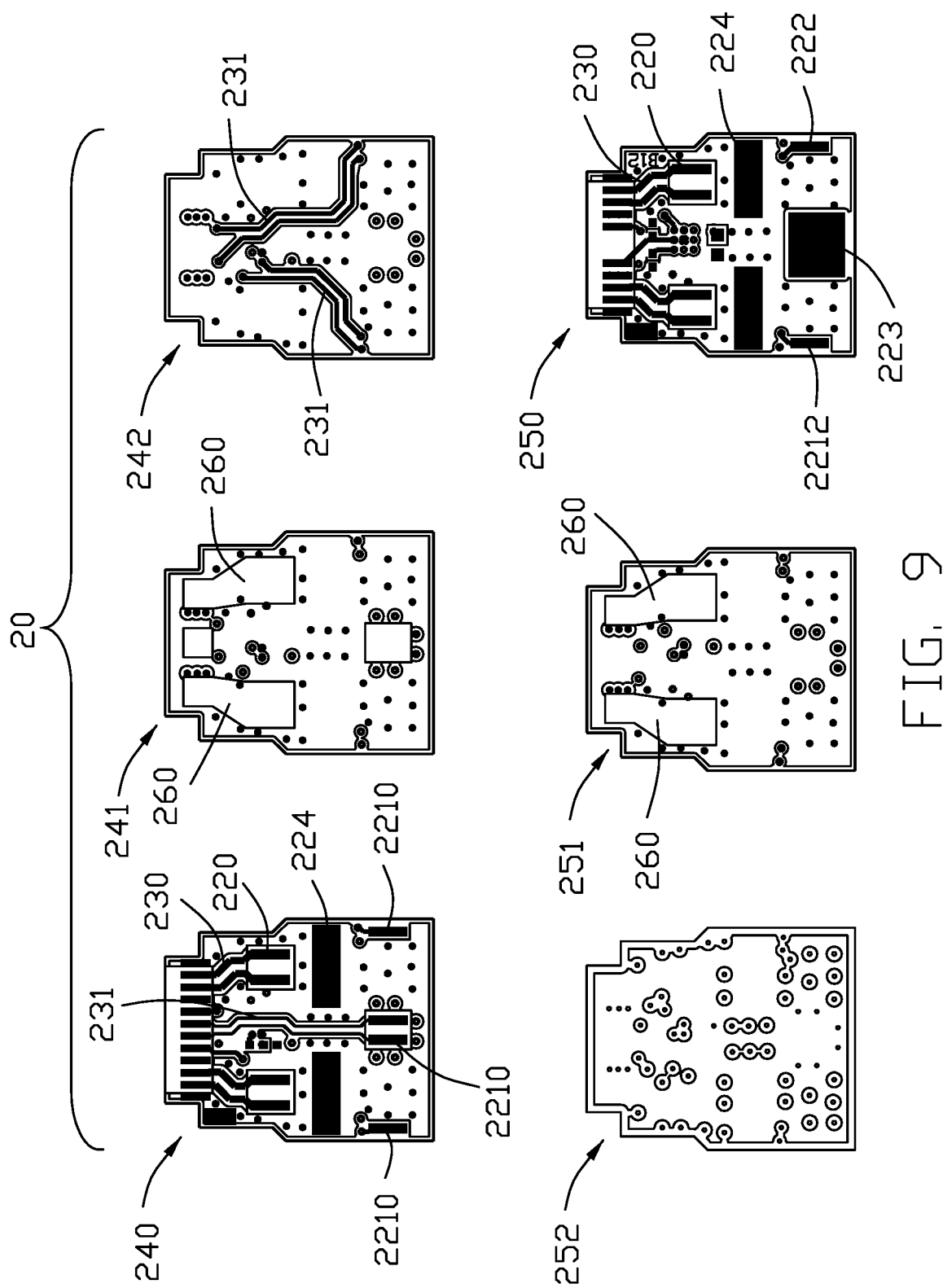
FIG. 9 is an exploded view of the first embodiment of a printed circuit board of a cable connector assembly as shown in FIG. 1.

Referring to FIG. 9, the printed circuit board 20 of the first embodiment of the present invention is a six-layer board structure and includes a first layer 240 disposed on the uppermost side, a second layer 241 disposed inside the first layer 240 and insulated from the first layer 240, a third layer 242 disposed inside the second layer 241 and insulated from the second layer 241, a fourth layer 250 disposed on the lowermost side, a fifth layer 251 disposed inside the fourth layer 250 and insulated from the fourth layer 250, and a sixth layer 252 disposed inside the fifth layer 251 and insulated from the fifth layer 251 and the second layer 241. The high speed pads 220, the grounding pads 224, and the high speed conductive path 230 are disposed on the first layer 240 and the fourth layer 250. The first low speed pad 2210 and the second low speed pad 2211 are disposed on the first layer 240. The third low speed pad 2212, the internal power pad 222, and the power pad 223 are disposed on the fourth layer 250. The low-speed conductive path 231 connected to the second low speed pad 2211 is disposed on the first layer 240, the low speed conductive path 231 connected to the first low speed pad 2210, the third low speed pad 2212, and a conductive path connected to the internal power pad 232 are disposed on the third layer 242, the conductive path connected to the power pad 233 is disposed at the sixth layer 252 for transmission. The low-speed conductive path 231 can be disposed on other layers according to specific needs. The second layer 241 is hollowed out at a position corresponding to the high speed pads 220, the high speed terminal pads 210 and the high speed conductive path 230 on the first layer 240 to form a hollow portion 260, the third layer 242 does not have a hollowing out corresponding to the aforementioned position as a reference ground and functions as an electromagnetic shield. Similarly, the fifth layer 251 and the second layer 241 have the same arrangement and efficacy, and the sixth layer 252 and the third layer 242 have the same arrangement and efficacy.

Figure 10:
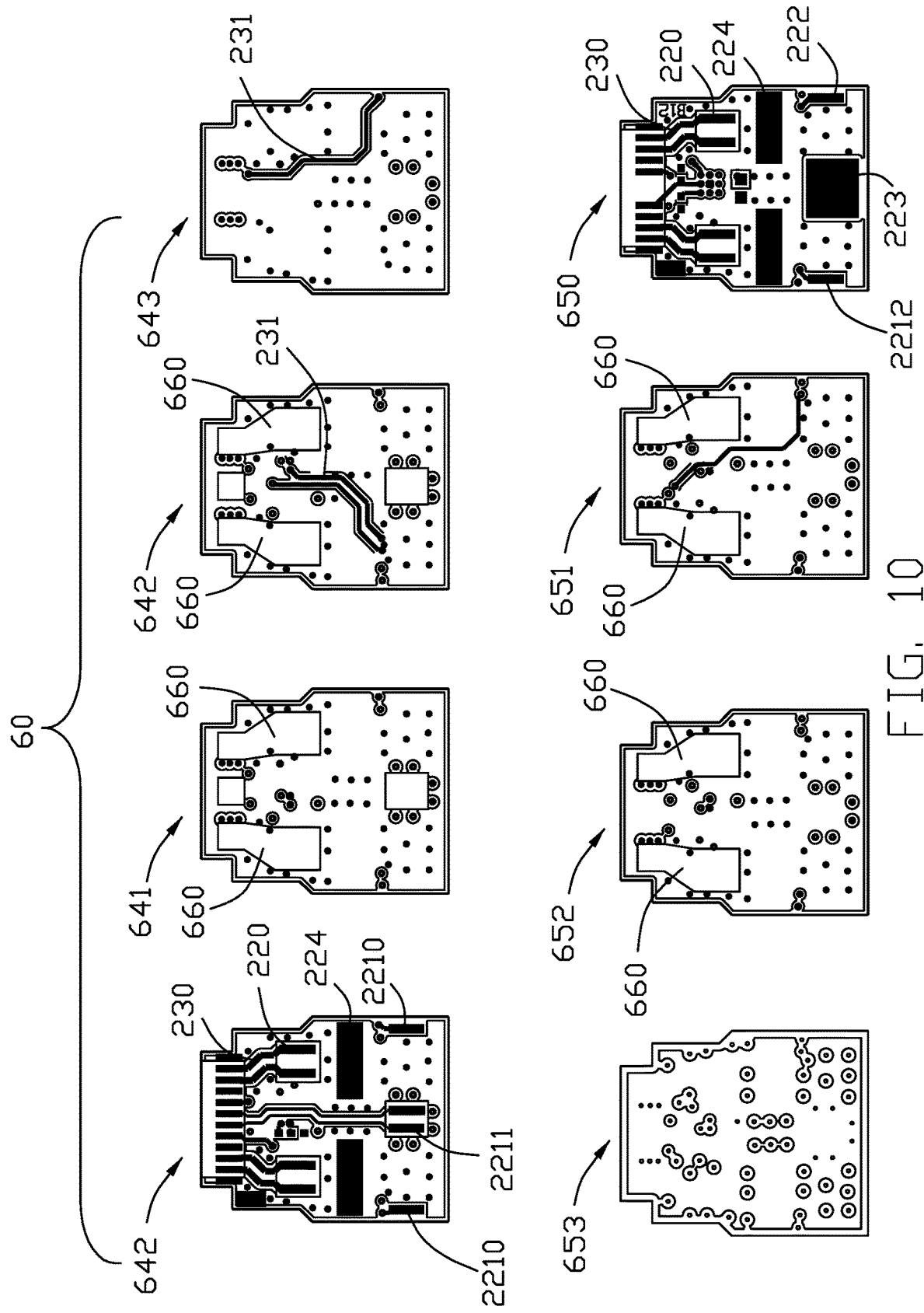
FIG. 10 is an exploded view of the second embodiment of a printed circuit board of a cable connector assembly as shown in FIG. 1.

Referring to FIG. 10, the printed circuit board 60 of the second embodiment of the present invention is a eight-layer board structure and includes a first layer 640 disposed on the uppermost side, a second layer 641 disposed inside the first layer 640 and insulated from the first layer 640, a third layer 642 disposed inside the second layer 641 and insulated from the second layer 641, a fourth layer 643 disposed inside the third layer 642 and insulated from the third layer 642, a fifth layer 650 disposed on the lowermost side, a sixth layer 651 disposed inside the fifth layer 650 and insulated from the fifth layer 650, a seventh layer 652 disposed inside the sixth layer 651 and insulated from the sixth layer 651, and a eighth layer 653 disposed inside the seventh layer 652 and insulated from the seventh layer 652 and the fourth layer 643. The low speed conductive path 231 connected to the first low speed pad 2210 and the third low speed pad 2212 and the conductive path connected to the internal power pad 232 are disposed on the second layer 641, the third layer 642, the fourth layer 643 and the seventh layer 652. The conductive path connected to the power pad 233 is disposed on the eighth layer 653 for transmission. The second layer 641 and the third layer 642 are hollowed out at a position corresponding to the high speed pads 220, the high speed terminal pads 210 and the high speed conductive path 230 on the first layer 640 to form a hollowed portion 660. The fourth layer 643 is not hollowed out corresponding to the aforementioned position as a reference ground and functions as an electromagnetic shield. Similarly, the fifth layer 651 and the sixth layer 652 have the same arrangement and effect as the second layer 641 and the third layer 642, and the eighth layer 653 has the same arrangement and effect as the fourth layer 643.

The path of the high-speed signal transmitted on the printed circuit board of the cable connector assembly of the present invention is shorter than the path for transmitting the low-speed signal, thereby shortening the transmission distance of the high-speed signal in the circuit board as much as possible, and facilitating higher-speed signal transmission.

What is claimed is:

1. A cable connector assembly comprising:
   a plug for mating with a docking connector and including a plurality of conductive terminals;
   a printed circuit board electrically connected to the plug; and
   a cable electrically connected to the connector and including a plurality of high speed signal cores for transmitting high speed signals and low speed signal cores for transmitting low speed signals, wherein
   the electrical path of the high speed signal cores connected to the corresponding conductive terminals is shorter than the electrical path of the low speed signal cores connected to the corresponding conductive terminals.

2. The cable connector assembly as claimed in claim 1, wherein the printed circuit board includes a plurality of terminal pads electrically connected to the conductive terminals, a plurality of cable pads soldered to the cables, and a conductive path connecting the terminal pads and the corresponding cable pads.

3. The cable connector assembly as claimed in claim 2, wherein the cable pads include high speed pads soldered to the high speed signal cores and low speed pads soldered to the low speed signal cores, and the conductive path connected to the high speed pads is shorter than the conductive path connected to the low speed pads.

4. The cable connector assembly as claimed in claim 3, wherein the conductive path connected to the high speed pads is wider than the conductive path connected to the low speed pads.

5. The cable connector assembly as claimed in claim 3, wherein the high speed pads are arranged in a row, and the low speed pads are arranged in the other row, and the row of high speed pads is closer to the plug than the other row of low speed pads.

6. The cable connector assembly as claimed in claim 3, wherein the printed circuit board includes a first layer disposed on the uppermost side, a second layer disposed inside the first layer and insulated from the first layer, and a third layer disposed inside the second layer and insulated from the second layer, the cable pads, the terminal pads and the conductive path are disposed on the first layer.

7. The cable connector assembly as claimed in claim 6, wherein the positions of the cable pads, the terminal pads and the conductive path corresponding to the high speed signals on the second layer are hollowed out.

8. The cable connector assembly as claimed in claim 6, wherein the printed circuit board further includes a fourth layer disposed inside the third layer and insulated from the third layer.

9. The cable connector assembly as claimed in claim 8, wherein the positions of the cable pads, the terminal pads and the conductive path corresponding to the high speed signals on the second layer and the third layer are hollowed out.

10. The cable connector assembly as claimed in claim 3, wherein the low speed pads include a first low speed pad disposed at an outermost area in a lateral direction of the printed circuit board, and a second low speed pad disposed in the middle of the lateral direction of the printed circuit board, and the high speed signal cores are spaced between the first low speed pad and the second low speed pad.

11. A cable connector assembly comprising:
    a plug for mating with a docking connector and including a plurality of conductive terminals;
    a printed circuit board electrically connected to the plug; and
    a cable electrically connected to the connector and including a plurality of high speed signal cores for transmitting high speed signals, low speed signal cores for transmitting low speed signals, and power cores for transmitting power, wherein
    the printed circuit board includes a plurality of terminal pads electrically connected to the conductive terminals, a plurality of cable pads soldered to the cables, and conductive paths connecting the terminal pads and the corresponding cable pads, respectively; wherein
    the cable pads connecting the low speed signal cores and those connecting the power cores are located behind those connecting the high speed signal cores in a front-to-back direction.

12. The cable connector assembly as claimed in claim 11, wherein on one surface of the printed circuit board, the cable pads connecting the low speed signal cores are located in a middle region and two outermost regions in a transverse direction perpendicular to the front-to-back direction.

13. The cable connector assembly as claimed in claim 12, wherein the high speed signal cores extend forwardly in the front-to-back direction between the cable pads connecting the low speed signal cores in the transverse direction.

14. The cable connector assembly as claimed in claim 11, wherein the cable pads further include a plurality of ground pads located between the cable pads connecting the high speed signal cores and those connecting the low speed signal cores in said front-to-back direction.

15. The cable connector as claimed in claim 11, wherein the printed circuit board is constructed of a plurality of layers, and some inner layers remove conductive material corresponding, in a vertical direction, to the terminal pads connecting signal speed terminals.

* * * * *